(12) United States Patent
Pal

(10) Patent No.: US 8,308,451 B2
(45) Date of Patent: Nov. 13, 2012

(54) INJECTION MOLDED FAN MOTOR CONTROLLER HOUSING WITH ADVANCED COOLING FEATURES

(75) Inventor: Debabrata Pal, Hoffman Estates, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 373 days.

(21) Appl. No.: 12/631,912

(22) Filed: Dec. 7, 2009

(65) Prior Publication Data

US 2011/0135520 A1    Jun. 9, 2011

(51) Int. Cl.
*F04B 39/02* (2006.01)
*F04B 35/04* (2006.01)
*H05K 7/20* (2006.01)

(52) U.S. Cl. ............ 417/370; 417/423.8; 361/695; 361/701

(58) Field of Classification Search .......... 417/369, 417/370, 423.8; 361/679.4–679.5, 694–695, 361/701, 715
See application file for complete search history.

(56) References Cited

U.S. PATENT DOCUMENTS

| | | | | |
|---|---|---|---|---|
| 5,156,535 A | * | 10/1992 | Budris et al. | 417/423.7 |
| 5,350,281 A | * | 9/1994 | Hagshenas | 417/371 |
| 5,494,413 A | * | 2/1996 | Campen et al. | 417/356 |
| 5,810,072 A | | 9/1998 | Rees et al. | |
| 5,997,261 A | * | 12/1999 | Kershaw et al. | 417/366 |
| 6,129,524 A | * | 10/2000 | Woollenweber et al. | 417/366 |
| 6,130,818 A | | 10/2000 | Severson | |
| 6,213,195 B1 | | 4/2001 | Downing et al. | |
| 6,293,769 B1 | * | 9/2001 | Radermacher et al. | 417/357 |
| 6,650,538 B1 | | 11/2003 | Chu et al. | |
| 6,731,031 B2 | | 5/2004 | Sarkar et al. | |
| 6,782,941 B2 | | 8/2004 | Lee | |
| 7,061,766 B2 | | 6/2006 | Wainwright et al. | |
| 7,262,965 B2 | | 8/2007 | Cheng | |
| 7,492,594 B2 | | 2/2009 | Pal | |
| 2005/0100461 A1 | * | 5/2005 | Izutani et al. | 417/423.8 |
| 2008/0098750 A1 | | 5/2008 | Busier | |

\* cited by examiner

*Primary Examiner* — Charles Freay
(74) *Attorney, Agent, or Firm* — Carlson, Gaskey & Olds, P.C.

(57) ABSTRACT

An example fan motor controller housing includes an inner fan housing, an outer fan housing including a base plate, plenums and air passages, stator vanes and a motor control housing. The inner fan housing, the outer fan housing, the stator vanes, and the motor control component housing are all made of a polymer. The fan motor controller housing also includes heat sinks attached to the plenums. The heat sinks are cooled by air flowing from air passages through the plenum. Motor controller components are attached to the heat sink and heat dissipates from the motor controller components to the heat sink.

17 Claims, 6 Drawing Sheets

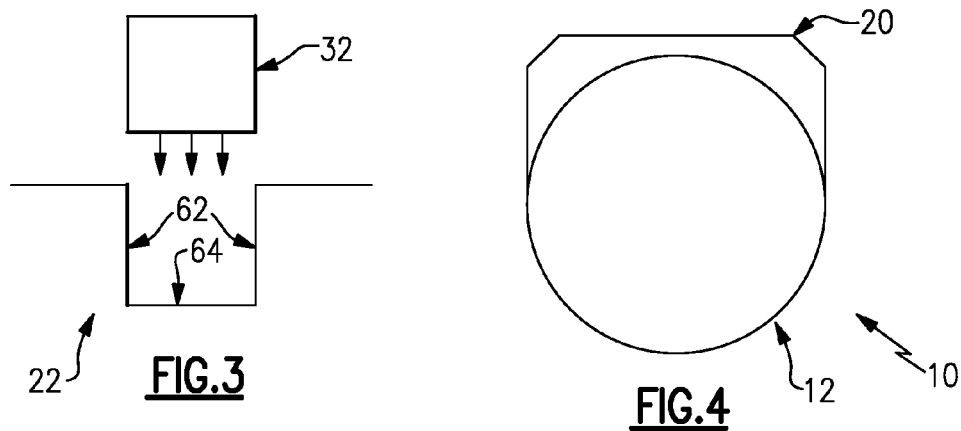
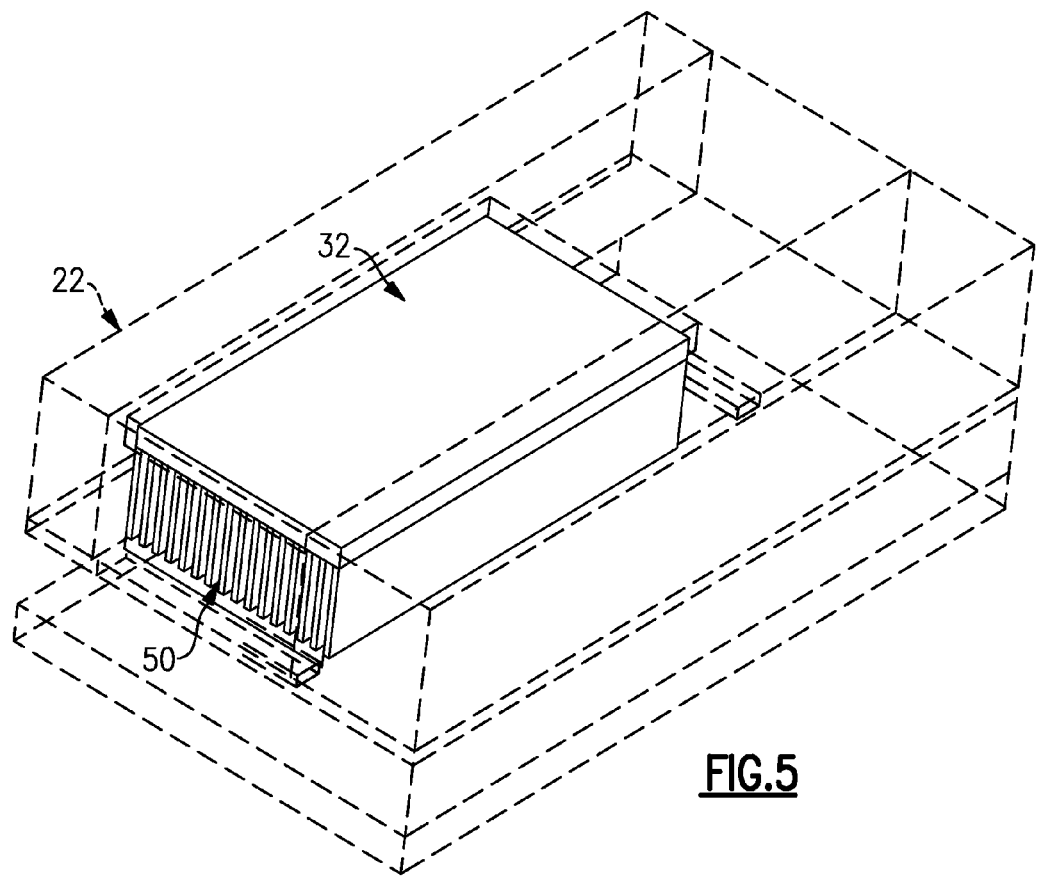

INJECTION MOLDED FAN MOTOR CONTROLLER HOUSING WITH ADVANCED COOLING FEATURES

BACKGROUND

This application relates generally to an injection molded fan motor controller housing using advanced cooling techniques.

Fan motor controller housings are known and typically include a housing and a motor controller assembly made up of a known metal, such as aluminum. The use of aluminum allows for good thermal conductivity resulting in adequate cooling of the motor controller components. Integral heat sinks are mounted on the fan housing for cooling purposes.

Typically air flows between the inner and outer housing via rotor blades and stator vanes to cool the heat sinks attached to the outer housing. The motor controller components, such as power modules, electronic controllers, and printed wiring board ("PWB") assemblies are typically mounted onto, or around the heat sink.

SUMMARY

An example fan motor controller housing includes an inner fan housing, an outer fan housing including a base plate, plenums and air passages, stator vanes and a motor control housing. The inner fan housing, the outer fan housing, the stator vanes, and the motor control component housing are all made of a polymer. The fan motor controller housing also includes heat sinks attached to the plenums. The heat sinks are cooled by air flowing from air passages through the plenum. Motor controller components are attached to the heat sink and heat dissipates from the motor controller components to the heat sink.

These and other features of the example disclosure can be best understood from the following specification and drawings, the following of which is a brief description:

BRIEF DESCRIPTION OF THE DRAWINGS

FIG. 3 is a side view of a cross section of a plenum without a heat sink.

FIG. 4 is a front view of the fan motor controller housing and motor control cover.

FIG. 5 is a top view of the parallel plates of a heat sink.

DETAILED DESCRIPTION

Figure 1:
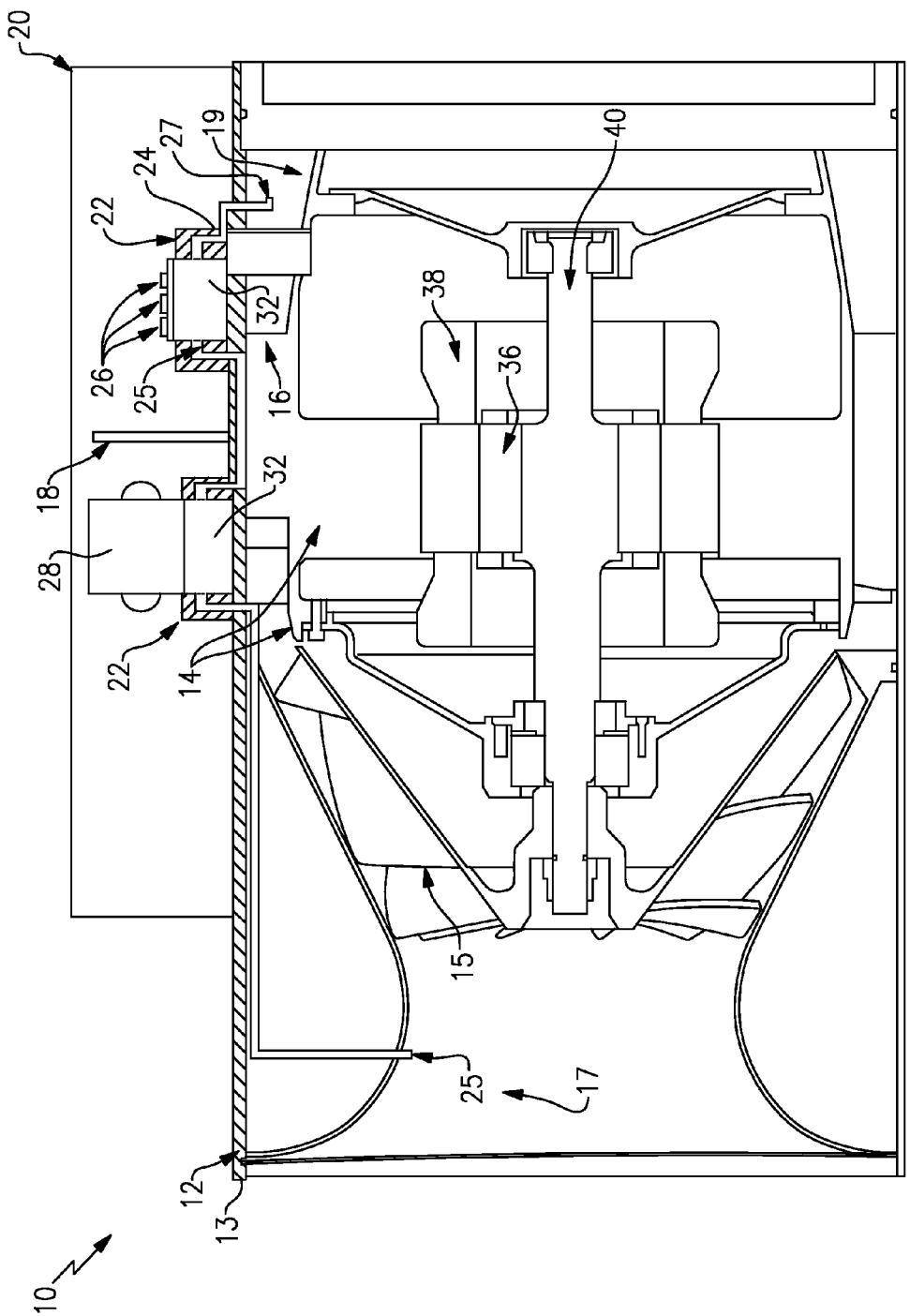
FIG. 1 is a side view of a fan and fan motor controller housing
Figure 2:
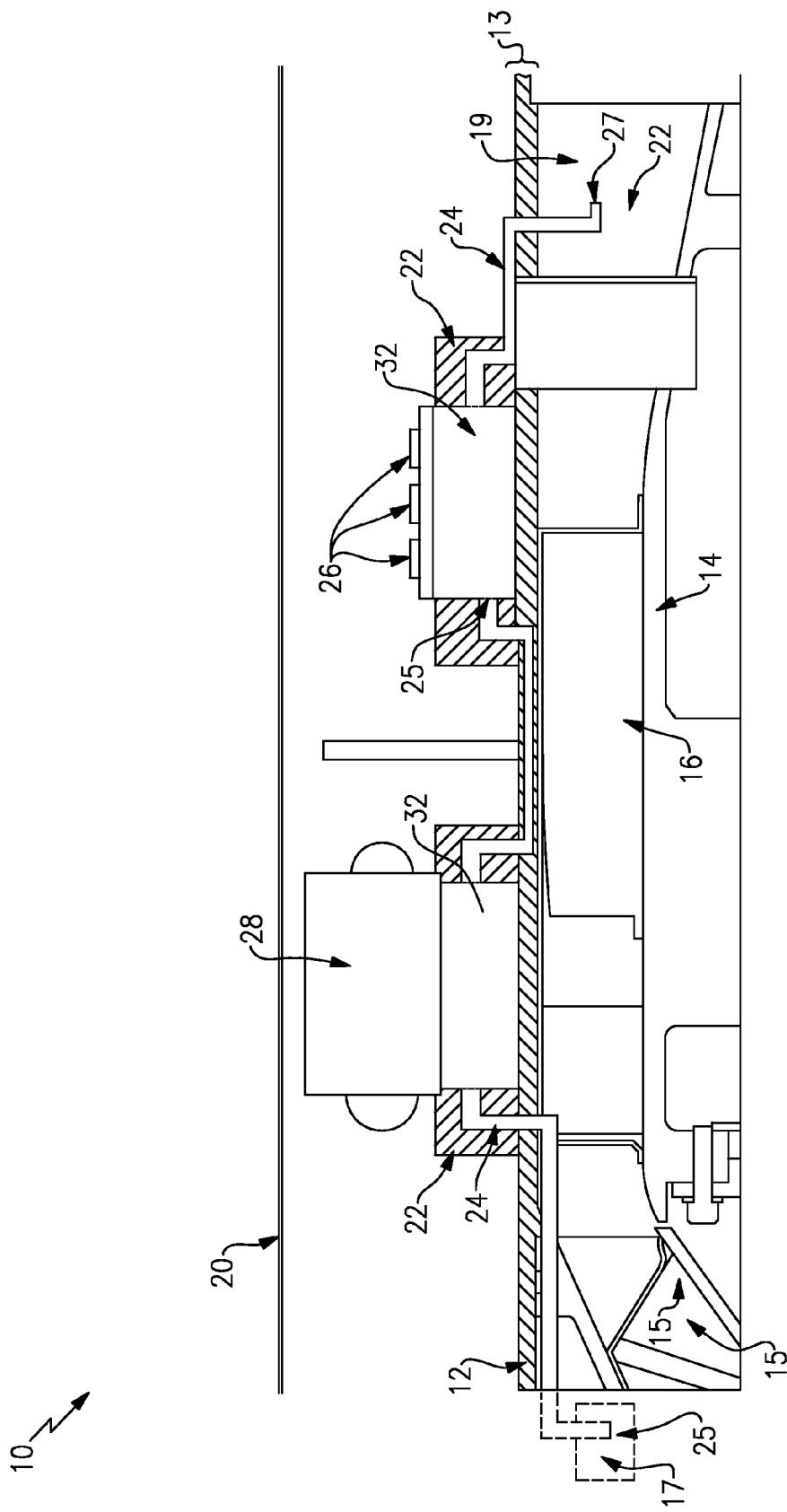
FIG. 2 is a magnified side view of the fan motor controller housing.

Referring to FIGS. 1 and 2, an example fan motor controller housing 10 is shown. The fan motor controller housing 10 includes an inner housing 14 and an outer housing 12. Both the inner housing 14 and outer housing 12 are made of a polymer. Within the inner housing 14, a stator 38 creates a magnetic field which forces magnets 36 to rotate. The magnets 36 in turn are attached to the rotor 40, forcing rotation of the rotor. The rotation of the rotor 40, also turns the rotor blades 15 causing air flow to move through the housing 10. The outer housing 12 includes a base plate 13, plenums 22, and air flow passages 24. Between the inner housing 14 and outer housing 12 are stator vanes 16, also made of a polymer. The rotor blade 15 created airflow creates a low pressure side 17 and high pressure side 19 with air flow direction being from the high pressure side 19 to the low pressure side 17.

The air flow created by the rotor blades 15 enters air flow passages 24 of the outer housing 12 through an inlet 27 within the outer housing 12 connecting to a plenum 22. Air flow moves through the air passages 24 due to the pressurization difference between the low pressure side 17 and the high pressure side 19. The air flow through the passages 24 is used for cooling. The air flow then exits the air passages 24 and returns inside the outer housing 12 through an outlet 25 of the air passages 24. The plenum 22 is also made of polymer and is an extension of the base plate 13 of the outer housing 12 formed by molding of the plenum 22 into outer housing 12. In an alternative, a plenum 22 may be molded individually and separately attached to the outer housing 12.

Referring to FIG. 3, with continuing reference to FIGS. 1 and 2, the plenums 22 include side walls 62 and a base wall 64. The plenums 22 contain heat sinks 32 which have motor controller components 26 attached to them. The motor controller components 26 can also include the PWB assembly 18, and work to operate the fan motor. The plenums 22 are created by attaching the heat sink 32 to the side walls 62 or base wall 64 of the plenums 22. The heat sinks 32 are attached to the side walls 62 and base wall 64 of the plenum 22 by molding the plenum 22 such that the heat sink 32 is dropped into and the plenum 22 and remains fixed by adhesive bonding. In the alternative, the heat sink 32 can be attached by mechanical or other known means or molded to the side walls 62 or base wall 64 of the plenum 22. The motor controller components 26 dissipate heat to the heat sink 32. The heat sinks 32 absorb the heat and undergo air cooling by air flow through the plenums 22. A plenum 22 in the alternative has an inductor assembly 28 attached to the heat sink 32 using potting material. Potting material is used to fill the gaps between the copper and iron of the inductor assembly 28, but also allows for attachment to the heat sink 32 and creates paths for enhanced heat conductivity within the inductor assembly 28. The inductor assembly 28 is cooled by further dissipating heat to the aluminum heat sinks 32, allowing the heat sinks 32 to increase cooling by air flow. The air flow in the air passages 24 is also able to cool the PWB assembly 18. A motor control cover 20, made of a polymer, encloses the elements against the outer housing 12.

Referring to FIG. 4 with continuing reference to FIGS. 1 and 2, a motor control cover 20 is schematically shown covering and protecting the plenums 22, heat sinks 32, motor control components 26, PWB assembly 18, inductor assembly 28, and air flow passages 22. In one example, the motor control 20 cover extends ⅔ of the length of the cylindrical outer housing 12. The motor control cover 20 also extends halfway down the side of the outer housing 12, where it is attached. The cover 20 can be attached to the outer housing 12 by mechanical or other means.

Referring to FIG. 5 with continuing reference to FIGS. 1 and 2, the heat sinks 32 are made up of parallel metal plates 50. The parallel metal plates 50 are made of aluminum or another comparable metal. The heat produced from the motor controller components 26 moves from the motor controller components 26 to the parallel plates 50 of the heat sink 32. The parallel arrangement allows for passage of air through the heat sink 32 as the parallel plates 50 are arranged such that air can flow between, underneath, or above the parallel plates 50, cooling the parallel plates 50 in the process.

Figure 6:
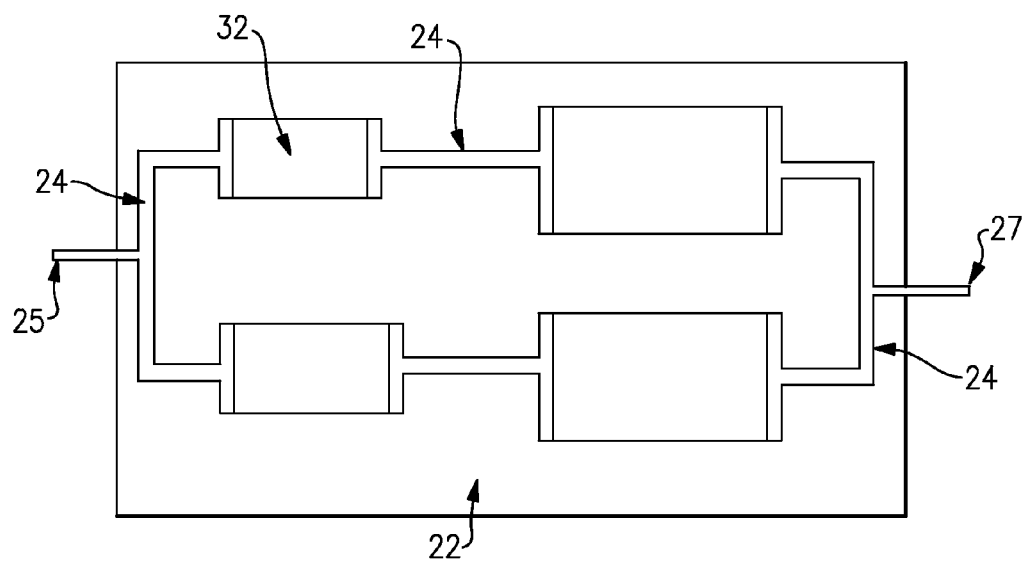
FIG. 6 is a top view of a plenum with heat sinks and air passages.

Referring to FIG. 6 with continuing reference to FIGS. 1-3, the air flow enters the plenums 22 through an inlet 27 of the air flow passages 24. The air flow passages 24 connect the plenums 22 and allow for air flow to cool the heat sinks 32. The passages 24 direct air flow through a number of heat sinks 32. When the air exits the plenum 22 using the air passages 24, it is either directed to another plenum 22 with additional heat sinks 32 or re-enters the housing 10 via an outlet 25 of the air passages 24. In this example, each additional heat sink 32 will have additional attached motor controller components 26 or an attached inductor assembly 28 for further cooling, Referring to FIG. 7, another example fan motor controller housing 210 around the fan is shown. The fan motor controller housing 210 includes an inner housing 214 and an outer housing 212. Both the inner housing 214 and outer housing 212 are made of a polymer. The outer housing 212 includes a base plate 213, plenums 222, and air flow passages 224. Between the inner housing 214 and outer housing 212 are stator vanes 216, also made of a polymer. There are also rotor blades 215 within the housing 210. The rotor blades 215 create airflow through the housing 210 by rotating within the housing 210, creating a low pressure side 217 and high pressure side 219 with air flow direction being from the high pressure side 219 to the low pressure side 217.

The air flow created by the rotor blades 215 enters air flow passages 224 of the outer housing 212 through an inlet 227 of the air flow passages 224. The air passages 224 connect to a plenum 222 and air flow moves through the air passages 224 due to the pressurization difference between the low pressure side 217 and the high pressure side 219. The air flow through the passages 224 is used for cooling. The air flow then exits the air passages 224 and returns inside the outer housing 212 through an outlet 225 of the air passages 224. The plenum 222 is also made of polymer and is an extension of the base plate 213 of the outer housing 212 formed by molding of the plenum 222 into outer housing 212. In the alternative, the plenum 222 may be molded independently and separately attached to the outer housing 212. The plenums 222 include side walls 262 and a base wall 264. The plenums 222 contain heat sinks 232 which have motor controller components 226 attached to them. The motor controller components 226 may also include the PWB assembly 218 and work to operate the fan motor. The plenums 222 are created by attaching the heat sink 232 to the side walls 262 or base wall 264 of the plenums 222. The heat sinks 32 are attached to the side walls 262 and base wall 264 of the plenum 222 by molding the plenum 222 such that the heat sink 232 is dropped into and the plenum 222 and remains fixed by adhesive bonding. In the alternative, the heat sink 232 can be attached by mechanical or other known means or molded to the side walls 262 or base wall 264 of the plenum 222. The motor controller components 226 dissipate heat to the heat sink 232. The heat sinks 232 absorb the heat and undergo air cooling by air flow through the plenums 222. This example also includes plenums 222 which do not hold heat sinks 232 but instead enclose an inductor assembly 230. The top wall 266 of the plenum is present to enclose the inductor 230 within the plenum 222. The inductor assembly 230 is cooled as air is brought into the enclosure through the air passages 224 and flows over the inductor 230 due to air pressure and out the air passages 224 returning to the housing 210. In this example, the inductor assembly 230 is directly attached to the plenum 222. Because the inductor assembly 230 is directly attached to the plenum 222 and not attached to a heat sink 232 using potting, there is reduced potting volume.

The reduced potting volume and subtraction of a heat sink 232 result in decreased weight for the fan motor controller housing 210.

Figure 8:
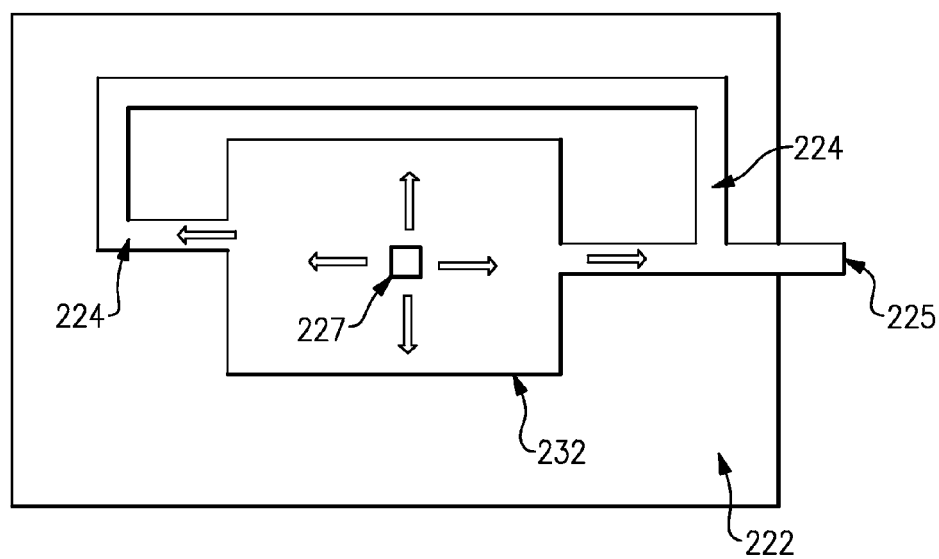
FIG. 8 is a top view of an impingement cooled heat sink showing the air inlet and air flow through the heat sink and plenum.
Figure 7:
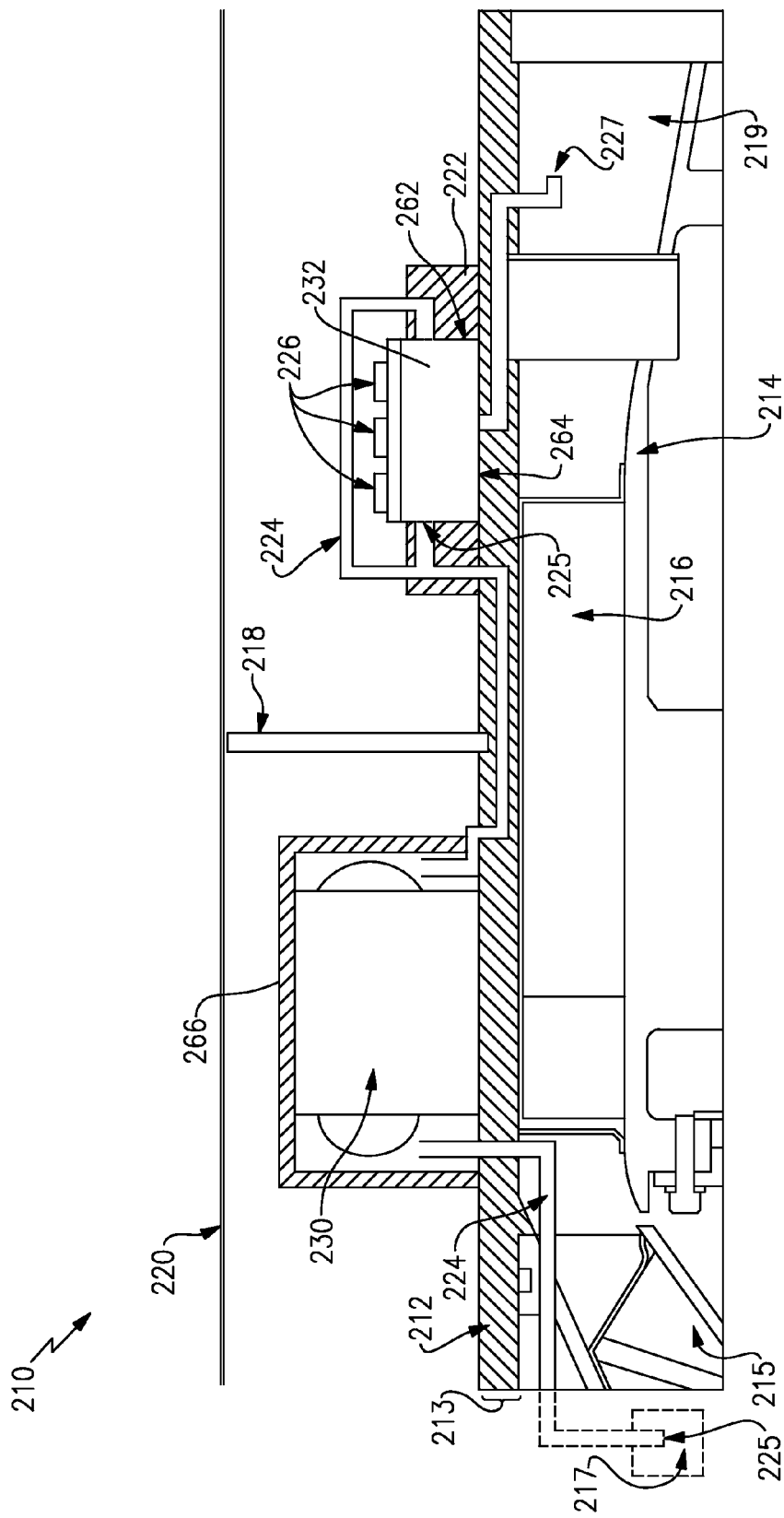
FIG. 7 is a magnified side view of an alternate fan motor controller housing using impingement cooling.

Referring to FIG. 8, with continuing reference to FIG. 7, in this example, the heat sinks 232 are cooled by impingement. The inlet 227 receiving air from within the outer housing 212 enters the plenum 222 from below, or in the alternative, on the back side of the heat sink 232 and directly cools the heat sink 232. The air moves across and through the heat sink 232, spreading in more than one direction for increased cooling. Air passages 224 then receive the air, the air passages joining together to move the air via the outlet 225 onto the next plenum 222 or back into the housing 210. Impingement cooling allows for a higher heat transfer coefficient which results in enhanced cooling. In one example, the height and size of the heat sink 232 is reduced due to the enhanced cooling. Parallel metal plates 50 made of aluminum or another comparable metal are also included in heat sinks 232. The heat produced from the motor controller components 226 and other similar motor control components transfer to the parallel plates 50 of the heat sink 232. The parallel arrangement allows for passage of air through the heat sink 232 cooling the parallel plates 50 in the process.

Figure 9:
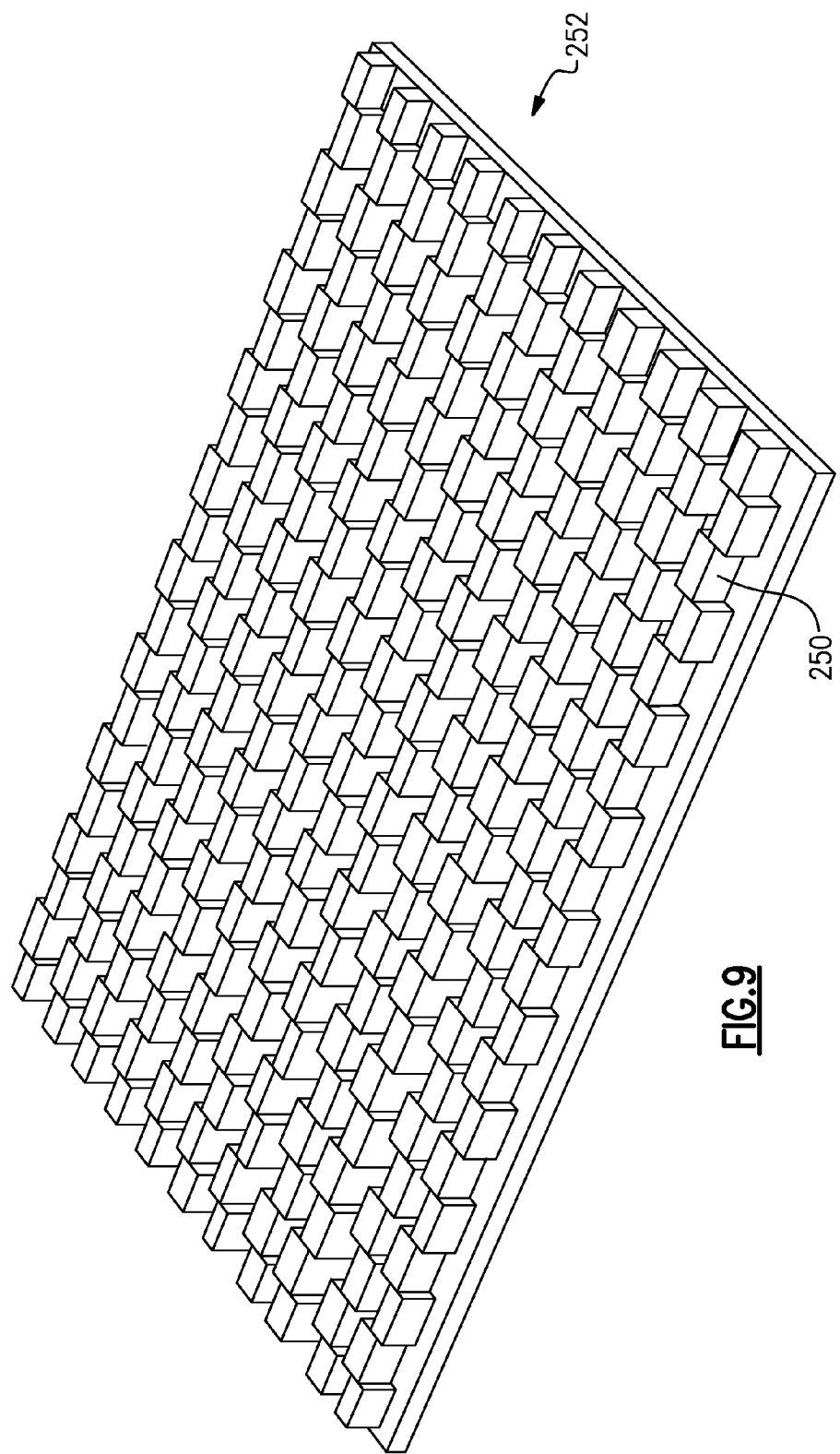
FIG. 9 is a top view of a lanced offset fin core.

Referring to FIG. 9, in one example the plates which make up the heat sink 232 are made of lanced offset fin core 252 instead of parallel plates 50. The lanced offset fin core 252 offsets different plates 250 in order to create greater surface area for heat to dissipate. It also works well with impingement cooling as the air comes from below and will cool more are of the lanced offset fin core 252 than it would if parallel plates 50 were used. This can also enhance impingement cooling as well as reduce heat sink 232 height and weight. In one example, the lanced offset fin cores are offset by ⅛ of an inch.

In one example, off the shelf heat sinks can be used, reducing production costs further. Motor controller components 26 are separately replaceable.

In one example, the polymer at hand is a high temperature polymer such as injection molded polyaryletheretherketone (PEEK), such as is made by Victrex Corporation. PEEK has a density of 1320 kg/m$^3$ compared to a density of 2770 kg/m$^3$ for aluminum. This PEEK polymer is used to make the inner housing 14, outer housing 12, plenums 22, motor control cover 20, and stator vanes 16. By incorporating the enhanced cooling techniques in the fan motor control housings 10 described above, PEEK, which previously could not be used due to poor thermal conductivity, is used, reducing the weight of the housing 10 with adequate cooling for the motor controller components.

Although a preferred embodiment has been disclosed, a worker of ordinary skill in this art would recognize that certain modifications would come within the scope of this invention. For that reason, the following claims should be studied to determine the true scope and content of this invention.

I claim:

1. A fan motor controller housing comprising:
   an inner fan housing;
   an outer fan housing, the outer fan housing including a base plate, at least one plenum, and air passages;
   a plurality of stator vanes;
   a motor control housing, the inner fan housing, the outer fan housing, the stator vanes, and the motor control housing made of a polymer;
   at least one heat sink, the heat sink attached to an at least one wall of the at least one plenum, the air passages configured to direct air flow within the outer fan housing to the at least one heat sink of the at least one plenum; and at least one motor control component, the motor control component attached to the heat sink.

2. The fan motor controller housing of claim 1, wherein the polymer is polyaryletheretherketone.

3. The fan motor controller housing of claim 2, wherein the stator vanes are attached to the inner housing.

4. The fan motor controller housing of claim 2, wherein the heat sink is aluminum.

5. The fan motor controller housing of claim 2, wherein there are at least two plenums, wherein the air passages connect the at least two plenums.

6. The fan motor controller housing of claim 2, wherein the stator vanes extend to the outer housing.

7. The fan motor controller housing of claim 2, wherein a core of the heat sink includes parallel fins.

8. The fan motor controller housing of claim 2, wherein the heat sink is attached to at least one wall of the plenum of the outer housing by bonding.

9. The fan motor controller housing of claim 2, wherein the plenum includes a cavity, the heat sink configured to sit in the cavity.

10. The fan motor controller housing of claim 2, wherein an inductor is attached to at least one heat sink.

11. The fan motor controller housing of claim 2, wherein the power module is bonded to the heat sink.

12. The fan motor controller housing of claim 2, wherein the power module is attached to the heat sink by mechanical means.

13. A fan motor controller housing comprising:
an inner fan housing;
an outer fan housing, the outer fan housing including a base plate, at least two plenums, and air passages to connect the plenums;
a plurality of stator vanes;
a motor control housing, the inner fan housing, the outer fan housing, the stator vanes, and the motor control housing made of a polymer;
at least one heat sink, the heat sink attached to at least one wall of a first plenum and cooled by impingement, the air passages configured to direct air flow within the outer fan housing directly to the heat sink;
at least one inductor enclosed by a top wall of a second plenum, the air passages directing air flow from the first plenum over the inductor in the second plenum; and
at least one motor control component, the motor control component attached to the heat sink.

14. The fan motor controller housing of claim 13, wherein the polymer is polyaryletheretherketone.

15. The fan motor controller housing of claim 14, wherein the heat sink is aluminum.

16. The fan motor controller housing of claim 14, wherein the motor control components are removable.

17. The fan motor controller housing of claim 15, wherein a core of the heat sink is lanced offset fins.

* * * * *